US 6,613,649 B2

(12) United States Patent
Lim et al.

(10) Patent No.: US 6,613,649 B2
(45) Date of Patent: Sep. 2, 2003

(54) METHOD FOR BUFFER STI SCHEME WITH A HARD MASK LAYER AS AN OXIDATION BARRIER

(75) Inventors: Seng-Keong Victor Lim, Singapore (SG); Feng Chen, Singapore (SG); Alex See, Singapore (SG); Wang Ling Goh, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 10/002,873

(22) Filed: Dec. 5, 2001

(65) Prior Publication Data

US 2003/0104675 A1 Jun. 5, 2003

(51) Int. Cl.[7] .............................................. H01L 21/76
(52) U.S. Cl. ....................................... 438/435; 438/701
(58) Field of Search ................................. 438/424, 435, 438/700, 701

(56) References Cited

U.S. PATENT DOCUMENTS

| | | | | |
|---|---|---|---|---|
| 5,130,268 A | * | 7/1992 | Liou et al. ................ 438/425 |
| 5,298,451 A | | 3/1994 | Rao ............................ 437/70 |
| 5,539,229 A | * | 7/1996 | Noble et al. ................ 257/301 |
| 5,776,808 A | * | 7/1998 | Muller et al. ............... 438/243 |
| 5,786,262 A | * | 7/1998 | Jang et al. .................. 438/424 |
| 5,817,568 A | * | 10/1998 | Chao ........................... 438/427 |
| 5,928,961 A | | 7/1999 | Lou et al. ................... 438/692 |
| 5,981,357 A | | 11/1999 | Hause et al. ................ 438/427 |
| 6,001,706 A | | 12/1999 | Tan et al. .................... 438/424 |
| 6,117,748 A | | 9/2000 | Lou et al. ................... 438/400 |
| 6,121,133 A | * | 9/2000 | Iyer et al. ................... 438/636 |
| 6,214,696 B1 | | 4/2001 | Wu ............................ 438/424 |
| 6,248,667 B1 | | 6/2001 | Kim et al. .................. 439/690 |
| 6,297,127 B1 | * | 10/2001 | Chen et al. ................. 438/424 |

FOREIGN PATENT DOCUMENTS

KR  0031114  * 9/2001  .......... H01L/21/76

* cited by examiner

*Primary Examiner*—Carl Whitehead, Jr.
*Assistant Examiner*—David S Blum

(57) ABSTRACT

A method of manufacturing a shallow trench isolation using a polishing step with reduced dishing. A pad layer, a polish stop layer, a buffer layer and a hard mask layer are formed over a substrate. The hard mask layer has a hard mask opening. We etch a trench opening in the buffer layer, the polish stop layer, the pad layer and form a trench in the substrate using the hard mask layer as an etch mask. We form an oxide trench liner layer along the sidewalls of the trench and an oxide buffer liner layer on the sidewalls of the buffer layer using a thermal oxidation. The hard mask layer prevents the oxidation of the top surface of the buffer layer during the oxidation of the oxide trench liner. This prevents the buffer layer from being consumed by the oxidation and leaves the buffer layer to act in the subsequent chemical-mechanical polish (CMP) step. Next, an insulating layer is formed at least partially filling the trench. The insulating layer is chemical-mechanical polished using the polish stop layer as a stop layer. The buffer layer acts to prevent field oxide dishing during the chemical-mechanical polish.

21 Claims, 5 Drawing Sheets

US 6,613,649 B2

METHOD FOR BUFFER STI SCHEME WITH A HARD MASK LAYER AS AN OXIDATION BARRIER

BACKGROUND OF INVENTION

1) Field of the Invention

This invention relates generally to fabrication of semiconductor devices and particularly to a method of forming isolation for integrated circuits, and more specifically, to a method of forming a shallow.trench isolation.

2) Description of the Prior Art

Semiconductor integrated circuits (ICs) have evolved towards increased density and device shrinkage. One important structure in the manufacture of ICs is isolation structures. Devices formed in the silicon substrate must be isolated from one another. Establishing effective isolation in submicron. ICs in the face of decreased isolation space is a complicated and challenging task.

One conventional-method for isolation involves oxidizing.a bare silicon wafer in a furnace to grow a pad oxide layer The pad oxide layer is most typically formed from silicon dioxide. A nitride layer is then deposited on the pad oxide layer. A masking and etching step is then performed to form trenches. Next, oxide is then deposited in the trenches by chemical vapor deposition (CVD). The CVD oxide is then planarized by a chemical mechanical polishing (CMP).

Planarization by the CMP presents several problems. The removal rate of the CVD oxide by the CMP is higher than the removal rate of the nitride, causing dishing in wide trenches. This dishing.effect degrades the planarity of a layer, and it also impacts the yield of the device. Furthermore, end point detection is not accurate during the CMP because the ratio of the removal rate of the CVD oxide to the removal rate of the nitride is about 3 or 4 to 1. Increasing this ratio to improve end point detection would result in increased dishing under this conventional method. Therefore, a need arises for a simple and efficient method of forming a trench isolation that reduces dishing.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,001,706 (Tan et al.) shows a STI planarization process. U.S. Pat. No. 5,928,961 (Lou et al.) shows a STI process using a transition layer. U.S. Pat. No. 5,981,357 (Hause et al.) teaches another STI planarization process. U.S. Pat. No. 5,298,451 (Rao) shows a related STI patent. U.S. Pat. No. 6,117,748 (Lou et al.), U.S. Pat. No. 6,214,69B1 (Wu). and U.S. Pat. No. 61248,667B1 (Kim et al.) show other planarization and STI processes.

SUMMARY OF THE INVENTION

It is an object of the present invention to provide a method for fabricating a shallow trench isolation (STI) having reduced dishing.

It is an object of the present invention to provide a method for fabricating,a shallow trench isolation (STI) using a buffer layer and chemical mechanical polish (CMP) process having reduced dishing.

It is an object of the present invention to provide a method for fabricating a shallow trench isolation (STI:) using hard mask layer over a buffer layer; the hard mask layer acts as an oxidation barrier during a trench liner oxidation.

An embodiment of the present invention provides a method of manufacturing a shallow trench isolation which is characterized as follows. A pad layer, a polish stop layer, a buffer layer and a hard mask layer are formed over a substrate. The hard mask layer has a hard mask opening. We form a trench opening in the buffer layer, the polish stop layer, the pad layer and form a trenching the substrate using the hard mask layer as an etch mask. We form an oxide trench liner layer along the sidewalls of the trench and an oxide buffer liner layer on the sidewalls of the buffer layer. The invention's hard mask layer prevents the oxidation of the top surface of the buffer layer during the oxidation of the oxide trench liner. This prevents the buffer layer from being consumed by the oxidation and leaves a sufficient thickness of buffer layer to act in the subsequent chemical-mechanical polish (CMP) step. Next, an insulating layer is formed over the hard mask layer and at least partially fills the trench. The insulating layer is chemical-mechanical polished using the polish stop layer as a stop layer. The buffer layer acts to prevent field oxide dishing during the chemical-mechanical polish (CMP). The polish stop layer is removed.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PROFFERED EMBODIMENTS

The present invention will be described in detail with reference to the accompanying drawings. The present invention provides a method of forming a method of forming a shallow trench isolation on a substrate. An important feature of the invention is the hard mask 26 that acts as an oxidation barrier to prevent the oxidation of the top surface of the buffer layer 22 (see FIG. 4). Another feature is the invention's insitu trench etch that limits the maximum thickness of the buffer layer 22 so that the narrow trenches can be etched.

Figure 1:
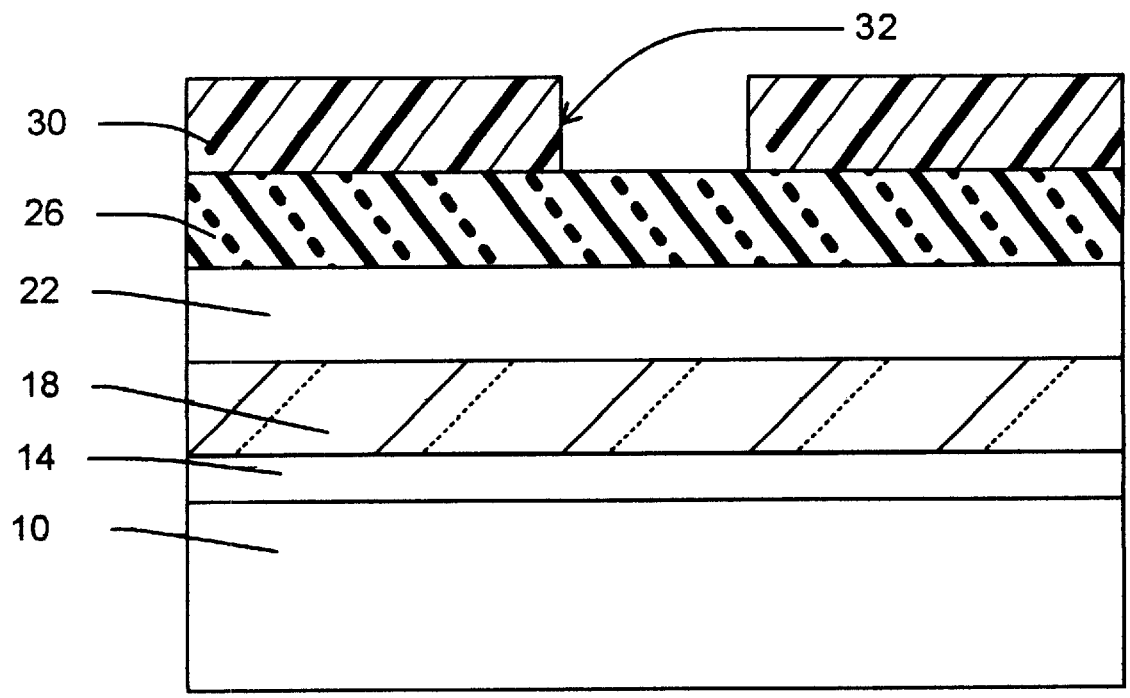
FIGS. 1 through 9 are cross sectional views for illustrating a preferred embodiment of the invention.

As shown in FIG. 1, a pad layer 14 is formed on the substrate 10. The substrate can be any suitable structure. The substrate can be a single crystal silicon having a <100> crystallographic orientation and can be conductively doped with a P type dopant such as boron. The embodiment is not limited to any type substrate.

Next, a polish stop layer 18 is formed on the pad layer 14. The polish stop can be comprised of silicon nitride, silicon oxynitride, or boron nitride, and most preferably of silicon nitride. The polish stop is preferably comprised of silicon nitride and preferably has a thickness between 800 and 2000.

Still referring to FIG. 1, a buffer layer 22 is formed on the nitride layer 18. The buffer layer 22 is preferably comprised of doped or undoped polysilicon. The poly layer can be doped with n or p type dopants with a concentration between 1E8 and 1E14 atoms/cc. The buffer layer oxidizes about twice as fast as the subsequently formed trench sidewall 36. (e.g., See FIG. 3).

A buffer layer 22 that is comprised of polysilicon preferably has a thickness between 900 and 1100 Å and more preferably about 1000 Å. This poly buffer layer 1000 Å thickness is a maximum thickness due to the limitation of a subsequent in-situ trench etch. If the buffer layer is thicker than about 1000 Å the insitu trench etch degrades because the slope of the trench sidewall will be affected.

Next, we form a hard mask layer (e.g., Cap layer) 26 on the polysilicon buffer layer 22. The hard mask layer is comprised of a material to can function as an oxidation barrier for a subsequent thermal oxidation step that forms an oxide trench liner layer. The hard mask layer is preferably comprised of silicon oxide, silicon oxide formed using TEOS, silicon nitride, or silicon oxynitride. The hard mask layer comprised of silicon oxide formed by TEOS is the most preferred material because silicon oxide is can be etched selective to polysilicon and because of the low cost of oxide.

The hard mask layer is preferably comprised of silicon oxide and preferably has a thickness between 500 and 1500 Å.

Next, the hard mask layer is patterned to form a second opening 28. See FIG. 2. Subsequently, a shallow trench isolation (STI) will be in the second opening. Referring to FIG. 1, to pattern the hard mask layer we preferably form a masking layer 30 having a first opening 32 on the hard mask layer 26. The masking layer is preferably comprised of photoresist.

Figure 2:
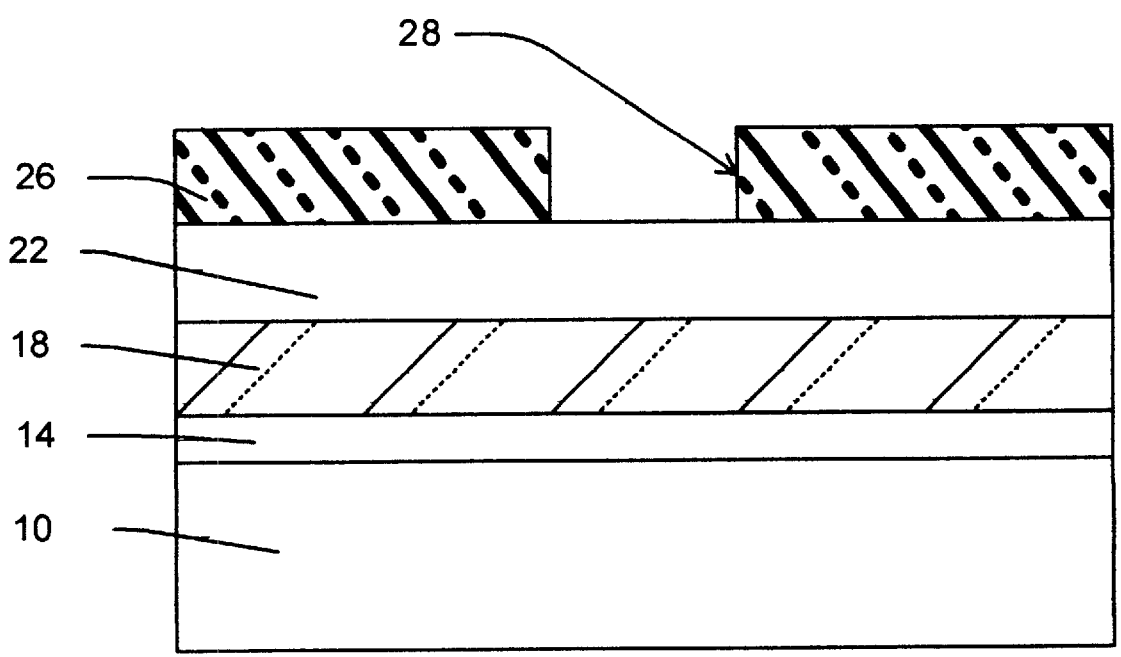

Referring to FIG. 2, we etch the hard mask layer 22 using the masking layer 30 as etch mask to form a second opening 28. The second opening 28 preferably has a dimension between 0.8 and 1.0 µm.

Next we remove the masking layer 30.

Figure 3:
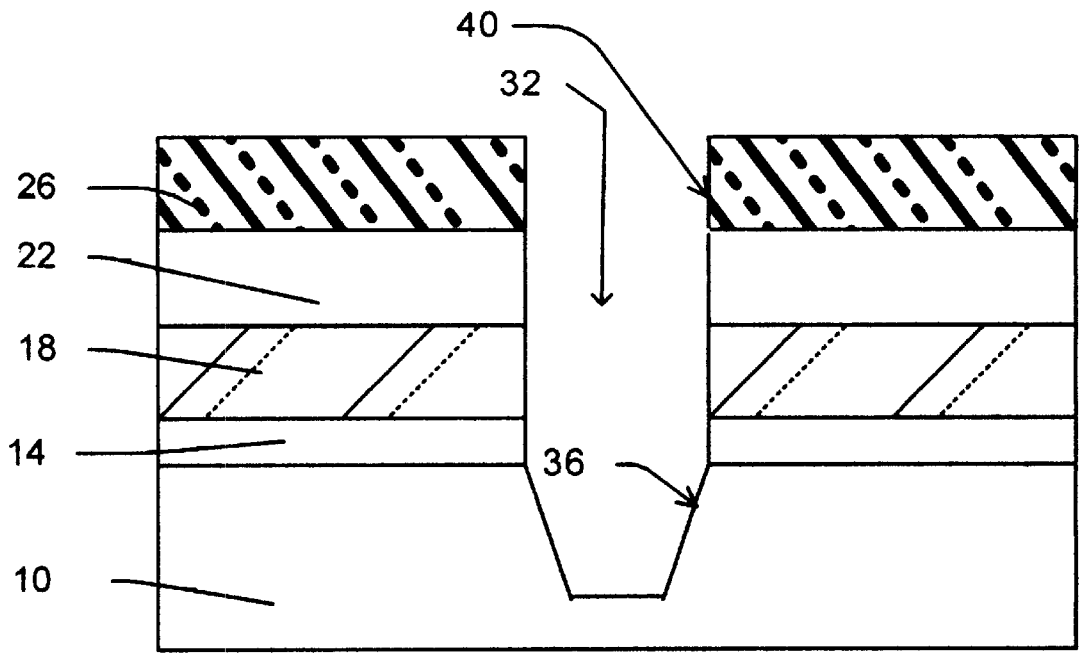

As shown in FIG. 3, using the hard mask layer 22 as an etch mask, we form a trench opening 32 in the (e.g., polysilicon) buffer layer 22, the (e.g., nitride) polish stop layer 18, and the pad layer 14, and form a trench 36 in the substrate 10.

Preferably an in-situ etch is used to etch through the buffer layer 22, the polish stop layer 18, the pad layer 14 and to form a trench 36 in the substrate 10.

The preferable in-situ etch requires the maximum poly buffer layer thickness to be about 1000 Å. During the etch process, the hard mask layer is eroded. To make sure that the masking layer is not completely eroded, the buffer layer thickness is preferably limited to less than 1000 Å.

The trench 32 preferably has a depth below the it substrate surface between 800 and 10,000 µ and a width between it 0.8 and 1.0 Åm.

Figure 4:
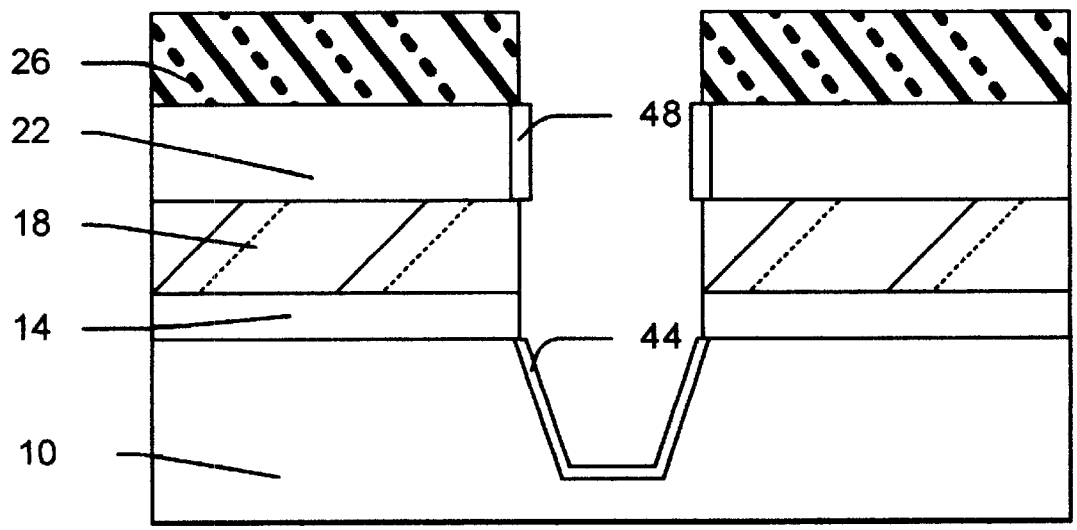

Referring to FIG. 4, an oxide trench liner layer 44 along the sidewalls of the trench 36 and an oxide buffer liner layer 48 on the sidewalls 38 of the buffer layer 22 are formed preferably using a thermal oxidation process. Importantly, the hard mask layer 26 acts as an oxidation barrier to reduce the oxidation of the buffer layer 22.

The oxide trench liner layer 44 and the oxide buffer liner layer 48 are preferably formed using a thermal oxidation process. The oxide trench liner.has a thickness between 200 and 300 Å and preferably about 240 and 260 Å. The oxide buffer liner layer 48 has a thickness between 500 and 1000 Å. The oxide buffer liner layer 48 consumes between 250 and 500 Å of the buffer sidewall, but only a negligible thickness of the top of the buffer layer because the hard mask 26 act as an oxidation barrier.

Next, optionally the hard mask layer 26 can be removed before the trench oxidelis deposited.

Figure 5:
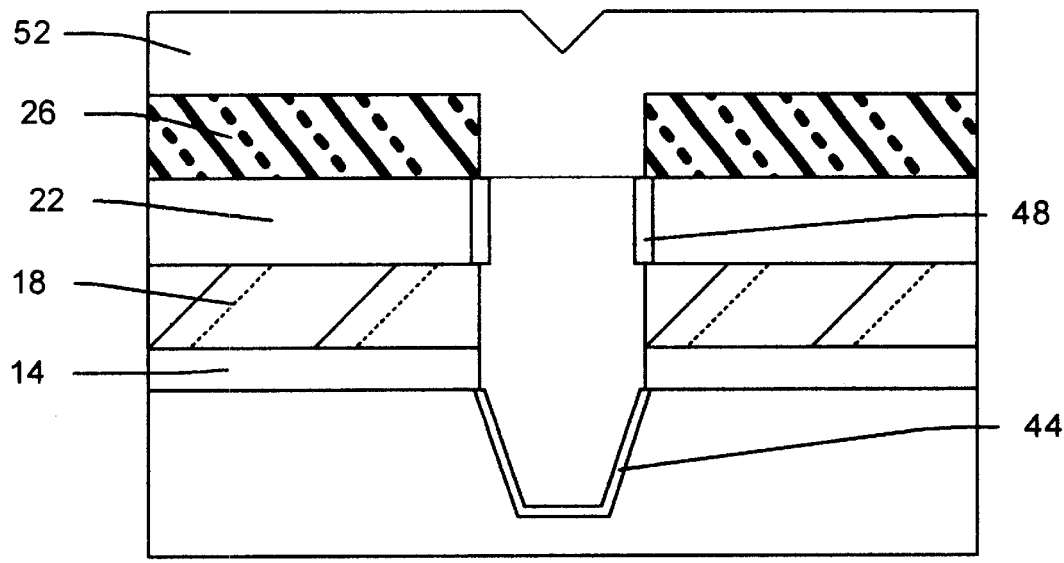

As shown in FIG. 5, we form an insulating layer 52 over the hard mask layer 26 and at least partially fill the trench 36. The insulating layer 52 can be comprised of silicon oxide, or other dielectric materials.

The insulating layer is preferably comprised of silicon oxide and has a thickness between 1000 and 5000 Å. The insulating layer is preferably formed by a high density plasma chemical vapor deposition (HDPCVD) process or a sub atmospheric chemical vapor deposition (SACVD) process.

Figure 6:
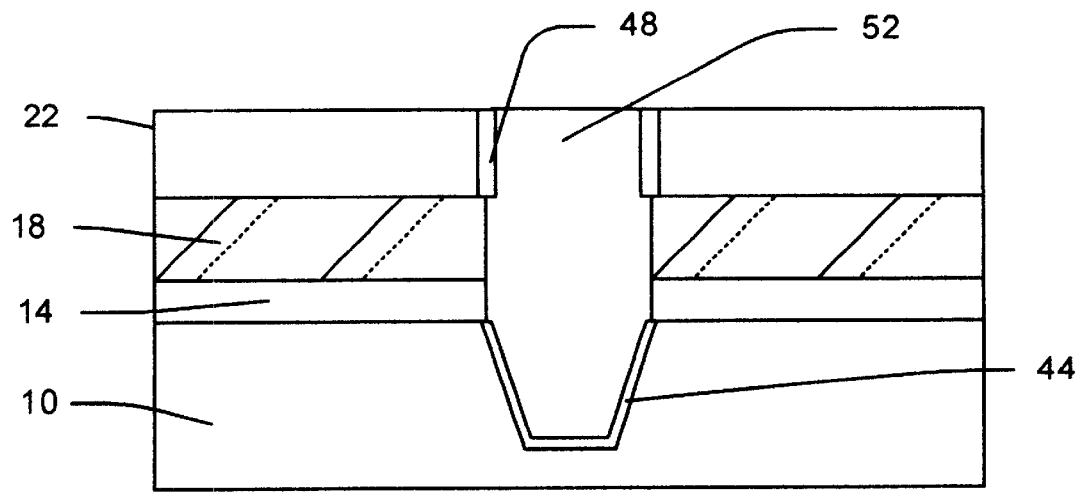

Next, we chemical-mechanical polish (CMP) the it structure. FIG. 6 shows a stage; in the CMP process when the CMP pad begins to touch the buffer layer 22.

Figure 7:
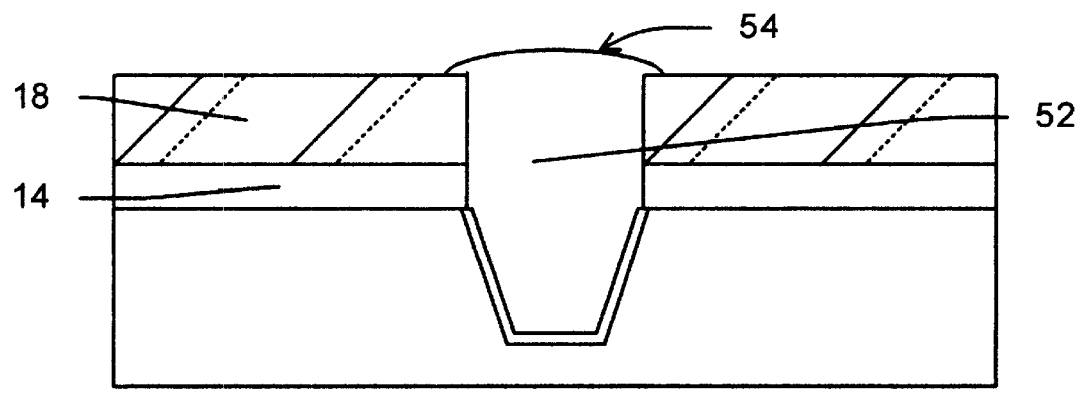

FIG. 7 shows the stage where the CMP polishes through the buffer layer and the polish stop layer 18 acts as a polish stop. The buffer layer 22 acts as a CMP buffer layer to prevent field oxide dishing during the chemical-mechanical polish (CMP). FIG. 7 shows a small (oxide) hump 54. The hump is created by the removal rate difference between the buffer layer 48 and the insulating layer 52. Typically, polysilicon is removed about 25 times faster than oxide under normal silica based slurry. The hump 54 shown in FIG. 7 will often develop across the STI trench.

Figure 8:
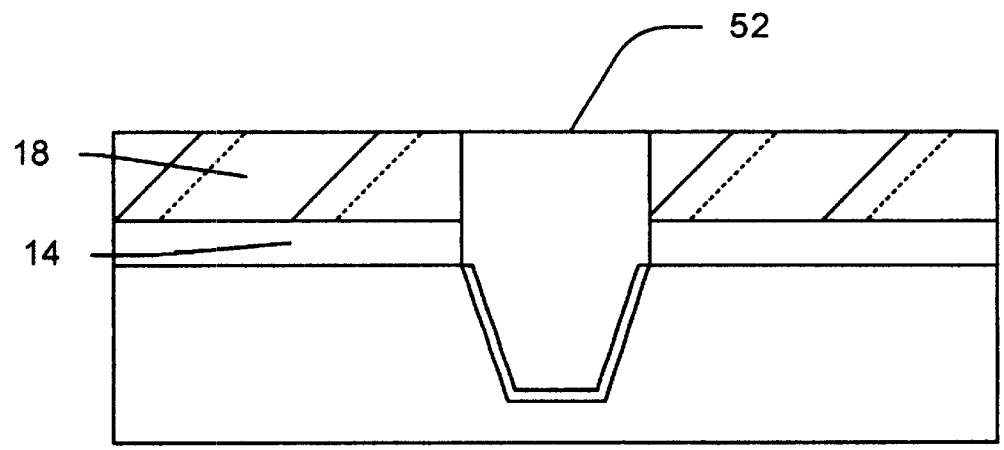

FIG. 8 shows the stage in the CMP process where a small over-polish step flattens or removes the hump. Hence CMP dishing is minimized.

Data shows that without the invention's poly buffer STI scheme with oxide hard mask layer, STI dishing in the range of 300 and 1000 Å occurs. With the invention's scheme, dishing is minimized to the range between 0 and 300 Å(depending on the trench width)

Figure 9:
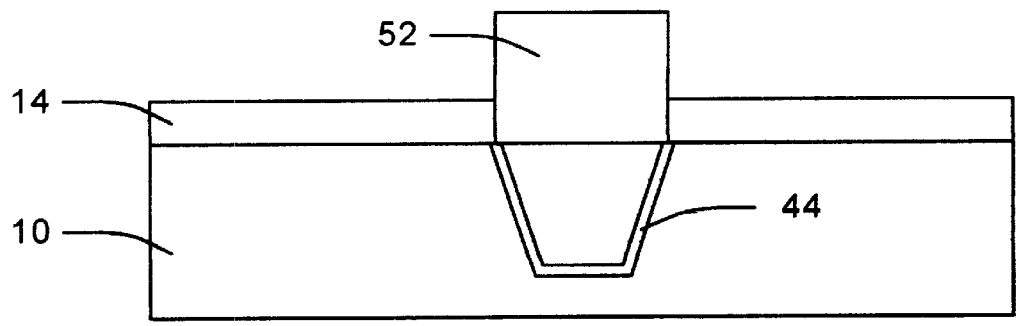

As shown in FIG. 9, the polish stop layer 18 is removed. The polish stop layer can be removed with a selective etch. In addition, the pad layer 14 can be removed.

Figure 10:
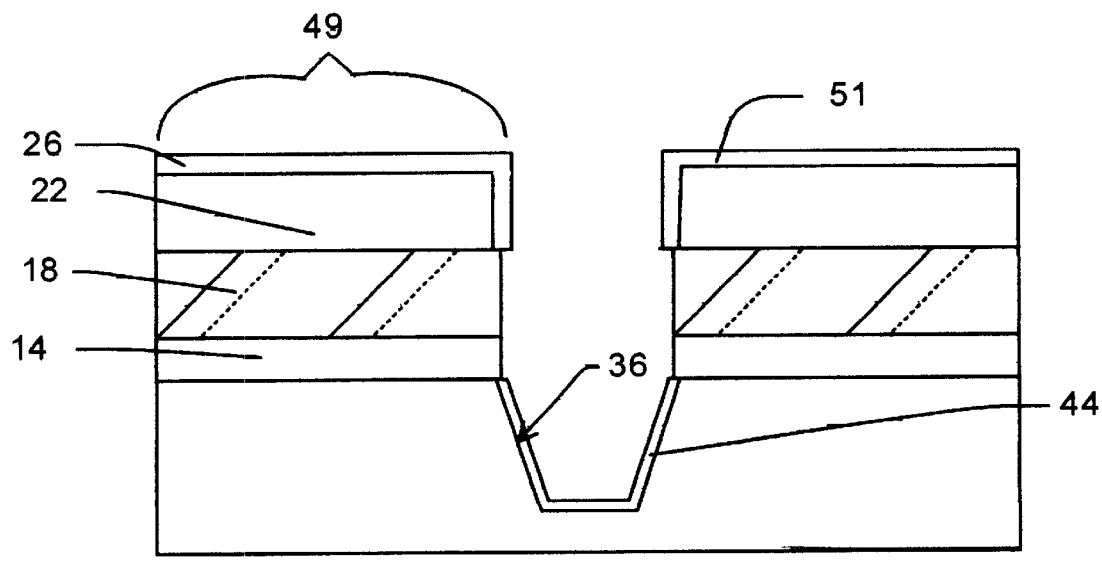
FIG. 10 is a cross sectional view for illustrating is a less preferred aspect where no hard mask is used and the buffer layer thickness is reduced by the oxidization of the trench liner.

FIG. 10 shows a process where the preferred embodiment's hard mask layer 26 is not formed. FIG. 10 shows the pad layer 14, the polish stop layer 18, the buffer layer 22, and the trench 36 in the substrate 10. FIG. 10 shows that when the thermal oxide trench liner 44 is grown, the poly buffer layer 22 is oxidized to form a thermal oxide layer 51 on the top surface (to form a top oxide buffer liner layer 49) and the sidewalls. This oxidation of the top surface of the poly buffer reduces the thickness of the poly buffer layer and significantly reduces the effectiveness of the poly buffer in the insulating layer (e.g., 52) chemical-mechanical polish (¸CMP) step. For example, if the buffer layer is initially 1000 Å thick and the oxide trench liner is about 300 Å, the remaining buffer layer thickness after the liner oxidation is about 800 Å. This 20% reduction in buffer thickness results in field oxide dishing because of the less effective cushioning of the dishing effect. The invention's hard mask 26 prevents this problem.

The invention's structure has significant advantages over other structures that using a poly buffer without an overlying oxide hard mask. Without the invention's oxide hard mask 26 that prevents the poly buffer layer 22 from being oxidized, a thicker buffer layer is required. The thicker buffer layer is needed to compensate for the buffer layer oxidized during the trench liner oxidation process. The thicker buffer layer causes the trench etch to have unfavorable trench slopes and other etch problems.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate different sized reactors as is known to those skilled in the art.

Unless explicitly stated otherwise, each numerical value and range should be interpreted as being approximate as if the word "about" or "approximately" preceded the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar.arrangements and procedures.

What is claimed is:

1. A method of forming a shallow trench isolation on a substrate comprising the steps of:
   a) forming a pad layer on said substrate;
   b) forming a polish stop layer on said pad layer; said polish stop is comprised of a material selected from the group consisting of silicon nitride, silicon oxynitride, and boron nitride;
   c) forming a buffer layer on said polish stop layer; said buffer layer is comprised of polysilicon; then
   d) forming a hard mask layer on said buffer layer; said hard mask layer having a hard mask opening; said hard mask layer is comprised of a material selected from the group consisting silicon oxide, silicon nitride, and silicon oxynitride;
   e) etching a trench opening in said buffer layer, said polish stop layer, said pad layer and etching a trench in said substrate using said hard mask layer as an etch mask;
   f) forming an oxide trench liner layer along the sidewalls of said trench and an oxide buffer liner layer on the sidewalls of said buffer layer; said oxide trench liner layer and said oxide buffer liner layer is formed using a thermal oxidation process; whereby said hard mask layer acts as an oxidation barrier to reduce the oxidation of said buffer layer;
   g) forming an insulating layer over said hard mask layer and filling said trench;
   h) chemical-mechanical polishing said insulating layer, said hard mask layer and said buffer layer using said polish stop layer as a stop layer; and
   i) removing said polish stop layer.

2. The method of claim 1 wherein said polish stop is comprised of silicon nitride and has a thickness between 800 and 2000 Å.

3. The method of the claim 1 wherein said buffer layer is comprised of polysilicon and has a thickness between 900 and 1100 Å.

4. The method of claim 1 wherein said hard mask layer is comprised of silicon oxide formed by using tetraethoxysilane or tetraethylorthosilicate (TEOS) and has a thickness between 500 and 1500 Å.

5. The method of claim 1 wherein said hard mask layer is comprised of a material to can function as an oxidation barrier for the oxidation step in forming said oxide trench liner layer.

6. The method of claim 1 wherein the step of forming said hard mask layer comprises:
   a) forming a hard mask layer on said buffer layer;
   b) forming a masking layer over said hard mask layer; said masking layer having a mask opening;
   c) etching said hard mask layer using said masking layer as etch mask to form a hard mask opening; and
   d) removing said masking layer.

7. The method of claim 1 wherein the etch through said buffer layer, said polish stop layer, said pad layer and to form a trench in said substrate, is an insitu etch.

8. The method of claim 1 wherein said trench has a depth below the substrate surface between 800 and 10,000 Å; and a width between 0.08 and 1.0 µm.

9. The method of claim 1 wherein said hard mask opening has a dimension between 0.08 and 1.0 µm.

10. The method of claim 1 wherein said insulating layer is comprised of silicon oxide and has a thickness between 1000 and 5000 Å.

11. The method of claim 1 wherein said insulating layer is formed by a high density plasma chemical vapor deposition process or a sub atmospheric chemical vapor deposition process.

12. The method of claim 1 wherein oxide trench liner layer is formed using a thermal oxidation process; and said oxide trench liner has a thickness between 200 and 300 Å; and said oxide buffer liner layer has a thickness between 500 and 1000 Å.

13. A method of forming a shallow trench isolation on a substrate comprising the steps of:
   a) forming a pad layer on said substrate;
   b) forming a polish stop layer on said pad layer; said polish stop is comprised of silicon nitride;
   c) forming a buffer layer on said nitride layer; said buffer layer is comprised of polysilicon;
   d) forming a hard mask layer on said polysilicon buffer layer; said hard mask layer is comprised of silicon oxide;
   e) forming a masking layer having a first opening on said hard mask layer;
   f) etching said hard mask layer using said masking layer as etch mask to form a second opening;
   g) removing said masking layer;
   h) in-situ etching to form a trench opening in said buffer layer, said polish stop layer, said pad layer and forming a trench in said substrate using said hard mask layer as an etch mask,
   i) forming an oxide trench liner layer along the sidewalls of said trench and an oxide buffer liner layer on the sidewalls of said buffer layer using a thermal oxidation process; whereby said hard mask layer acts as an oxidation barrier to reduce the oxidation of said buffer layer;
   j) forming an insulating layer over said hard mask layer and filling said trench;

k) chemical-mechanical polishing said insulating layer, said hard mask layer and said buffer layer using said polish stop layer as a stop layer; and chemical-mechanical polishing through said hard mask layer and through said buffer layer; and l) removing said polish stop layer.

14. The method of claim 13 wherein said polish stop is comprised of silicon nitride and has a thickness between 800 and 2000 Å.

15. The method of claim 13 wherein said buffer layer has a thickness between 900 and 1100 Å.

16. The method of claim 13 wherein said hard mask layer is comprised of silicon oxide formed using TEOS and has a thickness between 500 and 1500 Å.

17. The method of claim 13 wherein said second opening has a dimension between 0.08 and 1.0 μm.

18. The method of claim 13 wherein said trench has a depth below the substrate surface between 800 and 10,000 μ; and a width between 0.08 and 1.0 Åm.

19. The method of claim 13 wherein said oxide trench liner layer is formed using a thermal oxidation process; and said oxide trench liner has a thickness between 200 and 300 Å; said oxide buffer liner layer has a thickness between 500 and 1000 Å.

20. The method of claim 13 wherein said insulating layer is comprised of silicon oxide and has a thickness between 1000 and 5000 Å; said insulating layer is formed by a HDPCVD process or a SACVD process.

21. A method of forming a shallow trench isolation on a substrate comprising the steps of:

a) forming a pad layer on said substrate;

b) forming a polish stop layer on said pad layer; said polish stop is comprised of silicon nitride;

c) forming a buffer layer on said nitride layer; said buffer layer is comprised of polysilicon and has a thickness between 900 and 1100 Å;

d) forming a hard mask layer on said polysilicon buffer layer; said hard mask layer is comprised of silicon oxide formed using TEOS and has a thickness between 500 and 1500 Å;

e) forming a masking layer having a first opening on said hard mask layer;

f) etching said hard mask layer using said masking layer as etch mask to form a second opening;

g) removing said masking layer;

h) in-situ etching to form a trench opening in said buffer layer, said polish stop layer, said pad layer and forming a trench in said substrate using said hard mask layer as an etch mask;

i) forming an oxide trench liner layer along the sidewalls of said trench and an oxide buffer liner layer on the sidewalls of said buffer layer using a thermal oxidation process; whereby said hard mask layer acts as an oxidation barrier to reduce the oxidation of said buffer layer; said oxide trench liner layer is formed using a thermal oxidation process; and said oxide trench liner has a thickness between 200 and 300 Å; said oxide buffer liner layer has a thickness between 500 and 1000 Å;

j) forming an insulating layer over said hard mask layer and filling said trench;

k) chemical-mechanical polishing said insulating layer, said hard mask layer and said buffer layer using said polish stop layer as a stop layer and chemical-mechanical polishing through said hard mask layer and though said buffer layer; and l) removing said polish stop layer using an etch process.

* * * * *